US011011223B2

(12) United States Patent
Kowles et al.

(10) Patent No.: US 11,011,223 B2
(45) Date of Patent: May 18, 2021

(54) MEMORY SUB-SYSTEM GRADING AND ALLOCATION

(71) Applicant: Micron Technology, Inc., Boise, ID (US)

(72) Inventors: Andrew M. Kowles, Boise, ID (US); Kevin R. Brandt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/552,108

(22) Filed: Aug. 27, 2019

(65) Prior Publication Data

US 2021/0065789 A1 Mar. 4, 2021

(51) Int. Cl.
*G11C 11/56* (2006.01)
*G11C 16/34* (2006.01)
*G11C 29/12* (2006.01)
*G06F 11/10* (2006.01)

(52) U.S. Cl.
CPC ........ *G11C 11/5642* (2013.01); *G06F 11/102* (2013.01); *G11C 16/349* (2013.01); *G11C 16/3418* (2013.01); *G11C 29/12* (2013.01)

(58) Field of Classification Search
CPC ........ G11C 16/10; G11C 16/16; G11C 16/32; G11C 16/3495; G06F 11/3037; G06F 11/3055; G06F 12/0246; G06F 16/1847; G06F 2212/1036; G06F 2212/7208; G06F 2212/7211
See application file for complete search history.

(56) References Cited

U.S. PATENT DOCUMENTS

| 6,014,755 | A | 1/2000 | Wells et al. |
| 7,861,122 | B2 | 12/2010 | Cornwell et al. |
| 8,347,024 | B2* | 1/2013 | Sato ................... G06F 12/0246 |
| | | | 711/103 |
| 9,727,461 | B2* | 8/2017 | Nakao ..................... G06F 3/068 |
| 10,209,914 | B2* | 2/2019 | Agarwal ............ G11C 16/0483 |
| 10,366,771 | B2* | 7/2019 | Takizawa .............. G11C 16/16 |
| 2002/0184432 | A1 | 12/2002 | Ban |

(Continued)

FOREIGN PATENT DOCUMENTS

| KR | 1020140127355 A | 11/2014 |
| KR | 101699377 B1 | 1/2017 |
| WO | 2014092883 A1 | 6/2014 |

OTHER PUBLICATIONS

International Search Report and Written Opinion from related international application No. PCT/US2020/046636, dated Nov. 25, 2020, 11 pages.

*Primary Examiner* — Vanthu T Nguyen
(74) *Attorney, Agent, or Firm* — Brooks, Cameron & Huebsch, PLLC

(57) ABSTRACT

An apparatus includes a component coupleable to a memory device. The component can be configured to analyze a plurality of sets of memory cells of the memory device to determine quality attributes associated with the plurality of sets of memory cells and assign grades to one or more sets of the memory cells based, at least in part, on the determined quality attributes. The component can be configured to allocate at least one of the plurality of sets of memory cells for use by the memory device based, at least in part, on the assigned grade associated with the one or more sets of the memory cells.

19 Claims, 6 Drawing Sheets

(56) References Cited

U.S. PATENT DOCUMENTS

| | | |
|---|---|---|
| 2005/0235124 A1 | 10/2005 | Pomaranski et al. |
| 2012/0124273 A1 | 5/2012 | Gross et al. |
| 2013/0326116 A1 | 12/2013 | Goss et al. |
| 2015/0067415 A1* | 3/2015 | Miyamoto ............ G06F 11/073 714/704 |
| 2016/0041760 A1* | 2/2016 | Kuang ............... G11C 16/3495 711/103 |

* cited by examiner

MEMORY SUB-SYSTEM GRADING AND ALLOCATION

TECHNICAL FIELD

Embodiments of the disclosure relate generally to memory sub-systems, and more specifically, relate to memory sub-system grading and allocation.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
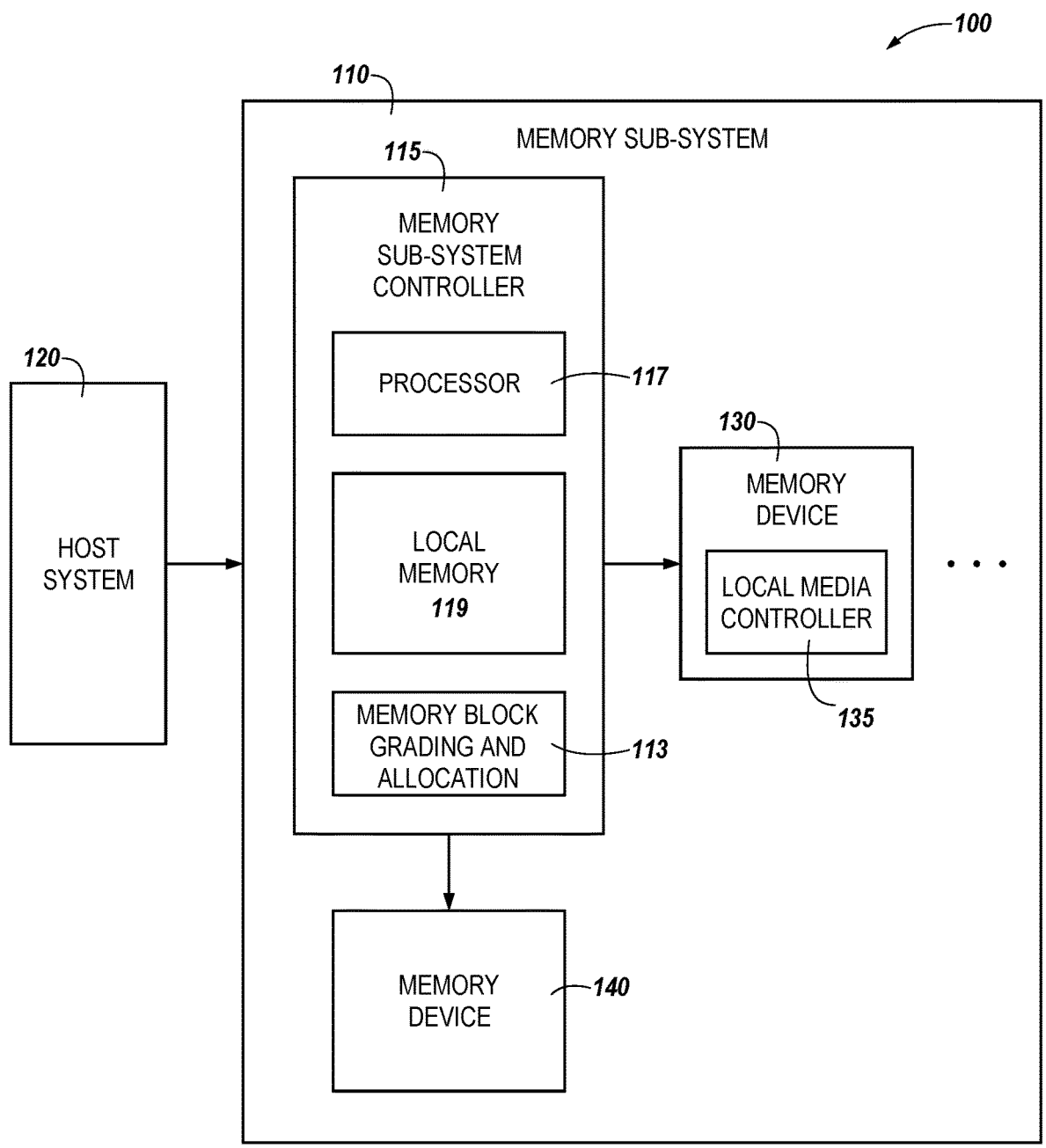
FIG. 1 illustrates an example computing environment that includes a memory sub-system in accordance with some embodiments of the present disclosure.

Aspects of the present disclosure are directed to memory sub-system grading and allocation, in particular, memory sub-systems that include a memory grading and allocation component. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

Memory sub-systems (e.g., SSDs) can include various sets of memory cells (e.g., blocks of memory cells, sectors of memory cells, etc.) in which data can be addressed and stored. Generally, a set of memory cells is a contiguous chunk of physical memory within a memory sub-system. As a result, the physical addresses associated with a set of memory cells are generally represented as a physically contiguous address space of the memory sub-system. During operation of the memory sub-system, data are addressed and stored within different sets of memory cells of the memory sub-system.

However, in general, different sets of memory cells of a memory sub-system are not equally robust. For example, due to process variation and/or defectivities introduced in the manufacturing stage of a memory sub-system, a tendency for errors to appear in a memory sub-system when the memory sub-system is powered down, and/or wear over time due to reads and writes, among other factors, some sets of memory cells of the memory sub-system may be more robust than others after the memory sub-system is manufactured.

In order to address the variance in robustness of sets of memory cells in a memory sub-system, various tests can be performed on the memory sub-system post-fabrication to collect information corresponding to the robustness of the various sets of memory cells within the memory sub-system. In some approaches, such tests can include determining which sets of memory cells contain greater than a threshold quantity of bad (e.g., degraded or unusable) memory cells and retiring sets of memory cells that contain greater than the threshold quantity of bad memory cells prior to sale of the memory sub-system.

Although such approaches can mitigate allocation of data to a quantity of bad sets of memory cells by retiring the sets of memory cells based on the threshold quantity of bad memory cells present in the sets of memory cells, sets of memory cells that can have some use (e.g., could be allocated for low criticality data, allocated for caching, allocated as single-levels cells, etc.) can be retired in some approaches. This can unnecessarily reduce an amount of available storage of the memory sub-system. In addition, as the size of memory sub-systems increases, the quantity of sets of memory cells that are retired post-fabrication can likewise increase using such approaches, further reducing the amount of available storage of the memory sub-system.

Further, as process technology trends toward smaller memory cells, the effects of process variability can become even more pronounced, which can lead to situations in which sets of memory cells may not be so efficiently categorized according to the binary "good set of memory cells/bad set of memory cells" dichotomy utilized in some approaches. For example, as process technology trends toward smaller memory cells, slight variances in the efficacy of the memory cells can allow for a greater stratification between memory cells that can be used for certain types of data and/or for certain periods of time prior to being retired, which is not contemplated by approaches that retire sets of memory cells post-fabrication based on a threshold quantity of memory cells within a set of memory cells being marked as bad.

In embodiments herein, a memory grading and block allocation component (which can be referred to herein as a "component," for simplicity) can be used to analyze quality attributes of sets of memory cells and assign grades to the memory cells based on the determined quality attributes. As described in more detail, herein, the grades assigned to the sets of memory cells by the memory grading and block allocation component can be used to rank performance of the sets of memory cells relative to one another. The memory grading and block allocation component can include hardware and/or instructions to perform these tasks. For example, the memory grading and block allocation component can be an application-specific integrated circuit (ASIC), a field-programmable gate array (FPGA), logic circuitry, or the like that can analyze quality attributes of sets of memory cells of a memory sub-system and/or assign grades to the sets of memory cells.

As used herein, "quality attributes" refer to characteristics of memory cells or sets of memory cells of a memory sub-system that correspond to how the memory cells or sets of memory cells will perform during operation of the memory sub-system. Non-limiting examples of quality attributes include a residual bit error rate associated with the memory cells or sets of memory cells, erase stress susceptibility associated with the memory cells or sets of memory cells, a physical location of the memory cells of sets of memory cells, a typical page programming time associated with the memory cells or sets of memory cells, a typical page read time associated with the memory cells or sets of memory cells, a program disturb susceptibility measure, a read disturb susceptibility measure, and/or a data retention error rate associated with the memory cells or sets of memory cells, among others.

Quality attributes can be further broken down into "quality sub-characteristics," which can include secondary grading criteria, such as read performance (e.g., a speed, accuracy, and/or quantity of neighboring sets of memory cells that contain data when read operations can be performed with a particular set of memory cells) and/or write performance e.g., a speed, accuracy, and/o quantity of neighboring sets of memory cells that contain data when write operations can be performed with a particular set of memory cells) associated with sets of memory cells of the memory sub-system. Quality sub-characteristics can be analyzed in the event that more than set of memory cells of a memory sub-system exhibits a same (or very similar) set of quality attributes. For example, if a first set of memory cells and a second set of memory cells exhibit a same (or very similar) set of quality attributes, the first set of memory cells and the second set of memory cells can be graded based on the quality sub-characteristics associated with the first set of memory cells and the second set of memory cells.

In some embodiments, the memory grading and block allocation component can allocate the memory cells and/or the sets of memory cells for different uses by the memory sub-system based on the assigned grades. In some embodiments, the memory grading and block allocation component can use the assigned grades to order the memory cells or sets of memory cells for use by the memory sub-system either at a certain time or for certain types of data. For example, the memory grading and block allocation component can cause the memory cells or sets of memory cells that have higher grades (e.g., high quality attributes) to be used first by the memory sub-system. In other embodiments, the memory grading and block allocation component can cause the memory cells or sets of memory cells that have lower grades (e.g., lower quality attributes) to be allocated for use in caching and/or as single level cells while causing the memory cells and/or sets of memory cells that have higher grades to be allocated as multi-level cells and/or for critical system data. In addition, a same set of memory cells can have more than grade assigned thereto depending on read/write properties of the memory sub-system. For example, a set of memory cells can have a first grade associated with writes to the set of memory cells and a second grade associated with reads to the set of memory cells.

This can allow for a higher quantity of memory cells and/or sets of memory cells to be used by the memory sub-system in comparison to the approaches that retire sets of memory cells if the set of memory cells exhibits greater than a threshold number of bad memory cells described above. Accordingly, embodiments described herein can improve the performance of a memory sub-system by allowing from a greater quantity of memory cells and/or set of memory cells to be allocated for use by the memory system in comparison to some approaches.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, internet-of-things enabled device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point are described, the memory device 130 can be based on any other type of non-volatile memory or storage device, such as such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), quad-level cells (QLCs), or a combination of such. In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory components 130.

In some embodiments, the memory devices 130 include local media controllers 135 that operate in conjunction with memory sub-system controller 115 to execute operations on one or more memory cells of the memory devices 130.

The memory sub-system 110 includes a memory block grading and allocation component 113 that can be configured to analyze sets of memory cells of the memory devices 130 to determine quality attributes associated with the sets of memory cells, assign grades to the sets of memory cells based on the determined quality attributes, and/or allocate the sets of memory cells for use by the memory devices 130 based on the assigned grades. Although not shown in FIG. 1 so as to not obfuscate the drawings, the memory block grading and allocation component 113 can include various circuitry to facilitate grading and allocation of the sets of memory cells. For example, the memory block grading and allocation component 113 can include a special purpose circuitry in the form of an ASIC, FPGA, state machine, and/or other logic circuitry that can allow the memory block grading and allocation component 113 to provide grading and allocation of sets of memory cells based on the determined quality attributes of the memory cells.

As described in more detail in connection with FIG. 2, the memory grading and allocation component 113 can be communicatively coupleable to the memory devices 130 and can access sets of memory cells (e.g., the sets of memory cell 218A to 218N illustrated in FIG. 2) to perform the operations described herein. In some embodiments, the operations performed by the memory grading and allocation component 113 can be performed during an initialization or pre-initialization stage of manufacture of the memory devices 130. For example, the memory grading and allocation component 113 can perform the operations described herein on the memory devices 130 prior to and/or during initialization of the flash translation layer of the memory devices 130.

Accordingly, in some embodiments, the memory grading and allocation component 113 can perform the operations described herein during fabrication and/or subsequent to fabrication of the memory devices 130 but prior to packaging of the memory devices 130.

In a non-limiting example, the memory grading and allocation component 113 can be configured to analyze sets of memory cells (e.g., the sets of memory cells 218A to 218N illustrated in FIG. 2) of the memory device 130 to determine quality attributes associated with the sets of memory cells. The quality attributes can include at least one of a residual bit error rate, an erase susceptibility, a program disturb susceptibility measure, a read disturb susceptibility measure, a data retention error rate, and/or a physical location of the one or more sets of the memory cells. The foregoing list is not intended to be exhaustive, however, and other non-limiting examples of quality attributes that can be determined by the memory grading and allocation component 113 can include a typical page programming time, a typical page read time, or other quality attributes corresponding to memory cells and/or sets of memory cells that can be measured or determined during wafer tests, probe tests, burn tests, NAND tests, or other factory tests that are used as part of outgoing quality monitoring of the memory device 130.

The memory grading and allocation component 113 can further be configured to assign grades to one or more sets of the memory cells based, at least in part, on the determined quality attributes. The grading can be provided in the form of one or more alphanumeric characters based on the determined quality attributes. For example, sets of memory cells that are determined to have the highest quality attributes can be graded with a letter grade (e.g., a grade of "A"), sets of memory cells that are determined to have a second highest quality attributes can be graded with a letter grade (e.g., a "B") and so forth until sets of memory cells that are determined to have the lowest quality attributes can be graded with a letter grade (e.g., an "F"). In some embodiments, the sets of memory cells can be graded a scale of 1-10, 1-100, etc., so long as there are at least three distinct grades assigned to the sets of memory cells. Embodiments are not so limited, however, and in some embodiments, the set of memory cells can be graded across a continuous spectrum of grades defined by a range of quality attributes associated with the sets of memory cells. Further, in some embodiments, memory grading and allocation component 113 can be configured to allocate separate grades to a same set of memory cells to be used when data is either written to, or read from, the set of memory cells. For example, the memory grading and allocation component 113 can assign a first grade to a particular set of memory cells for writes performed thereto and a second grade to the particular set of memory cells for reads performed therefrom.

The memory grading and allocation component 113 can further be configured to allocate at least one of the sets of memory cells for use by the memory device based, at least in part, on the assigned grade associated with the one or more sets of the memory cells. In some embodiments, the memory grading and allocation component 113 can be configured to allocate a first set of memory cells that has a higher assigned grade than a second set of memory cells such that the first set of memory cells is used by the memory device prior to the second set of memory cells being used by the memory device based, at least in part, on the grade assigned to the first set of memory cells and the grade assigned to the second set of memory cells. For example, if the memory grading and allocation component 113 has assigned a grade of "A" to the first set of memory cells and a grade of "C" to the second set of memory cells, the memory grading and allocation component 113 can allocate usage of the first and second set of memory cells such that the first set of memory cells is used by the memory device 130 before the second set of memory cells is used by the memory device 130.

In some embodiments, the memory grading and allocation component 113 can be configured to assign a first grade to a first set of memory cells and assign a second grade to a second set of memory cells. The memory grading and allocation component 113 can then determine that the first grade is indicative of the quality attributes of the first set of memory cells being higher than the quality attributes of the second set of memory cells and allocate the first set of memory cells for use by the memory device for a first type of data based on the determination and/or allocate the second set of memory cells for use by the memory device for a second type of data based on the determination. For example, the memory grading and allocation component 113 can allocate the first set of memory cells for use as multi-level cells and allocate the second set of memory cells for use as single-level cells based on the determination that the quality attributes of the first set of memory cells is higher than the quality attributes of the second set of memory cells. Embodiments are not so limited, however, and in some embodiments, the memory grading and allocation component 113 can allocate the first set of memory cells for use by system critical data and allocate the second set of memory cells for use by data that is not system critical, or for data caching, or for metadata.

Figure 2:
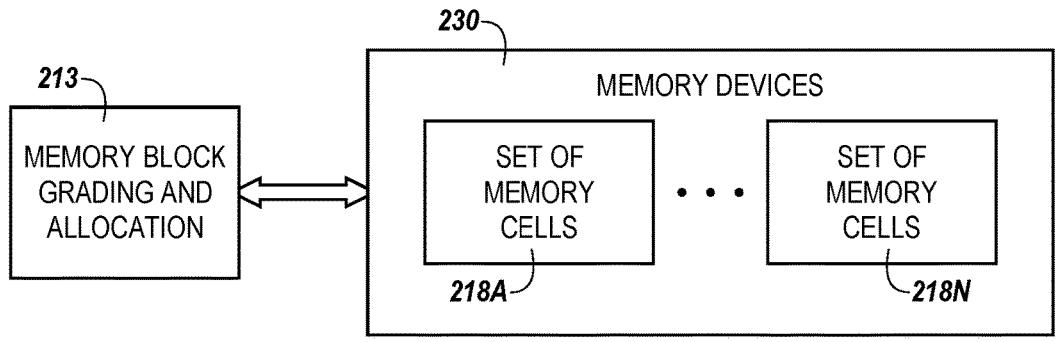
FIG. 2 illustrates an example of a memory device and memory block grading and allocation component in accordance with some embodiments of the present disclosure.

FIG. 2 illustrates an example of a memory device 230 and memory block grading and allocation component 213 in accordance with some embodiments of the present disclosure. The memory device 230 can include sets of memory cells 218A to 218N. The sets of memory cells 218A to 218N can correspond to blocks of memory, pages of memory, sectors of memory, or other physically contiguous chunks of memory cells of the memory device 230. The memory device(s) 230 can be analogous to the memory devices 130 illustrated in FIG. 1 and the memory block grading and allocation component 213 can be analogous to the memory block grading and allocation component 113 illustrated in FIG. 1, herein.

During fabrication and testing of the memory device(s) 130, the memory block grading and allocation component 213 can perform tests (or use data from tests performed by other equipment in a memory device testing facility) on the sets of memory cells 218A to 218N to determine quality attributes (e.g., the quality attributes 319A to 319N illustrated in FIG. 3) of the memory cells contained in each of the sets of memory cells 218A to 218N. As described above, the quality attributes can include residual bit error rates, erase susceptibility, data retention error rate, a program disturb susceptibility measure, a read disturb susceptibility measure, a physical location of the one or more sets of the memory cells, a typical page programming time, a typical page read time, or other quality attributes corresponding to memory cells and/or sets of memory cells that can be measured or determined during wafer tests, probe tests, burn tests, NAND tests, or other factory tests that are used as part of outgoing quality monitoring of the memory device 230.

The memory block grading and allocation component 213 can use the determined quality attributes to assign grades to the sets of memory cells 218A to 218N and/or rank the graded sets of memory cells 218A to 218N as part of an allocation scheme.

In a non-limiting example, a component (e.g., the memory block grading and allocation component 213) can be coupled to the memory device 230 and can be configured to analyze a first set of memory cells (e.g., the set of memory cells 218A) of the memory device 230 to determine quality attributes associated with the first of set of memory cells and analyze a second set of memory cells (e.g., the set of memory cells 218N) of the memory device 230 to determine quality attributes associated with the second of set of memory cells. The component can be further configured to assign a first grade to the first set of memory cells based, at least in part, on the on the determined quality attributes of the first set of memory cells and assign a second grade to the second set of memory cells based, at least in part, on the on the determined quality attributes of the second set of memory cells. The quality attributes can include at least one of a residual bit error rate, an erase susceptibility, a data retention error rate, a typical page programming time, a typical page read time, or a physical location of the one or more sets of the memory cells, or combinations thereof. Other non-limiting examples of quality attributes can include a program disturb susceptibility measure, a read disturb susceptibility measure, variation/distribution of program time, variation/distribution of read time, worst case program time, and/or worst case read time, etc. The component can be further configured to allocate the first set of memory cells for use by the memory device 230 for a first type of data and allocate the second set of memory cells for use by the memory device 230 for a second type of data. In some embodiments, the first type of data can include system data and the second type of data can include cache data. In addition, in some embodiments, the first type of data can include data to be retained by the memory device for greater than a threshold period of time (e.g., "hot data") and the second type of data comprises data to be retained by the memory device for less than the threshold period of time (e.g., "cold data"). For example, the first type of data and the second type of data can be stored in a tiered fashion in the memory device 230 based on the assigned grades of the sets of memory cells and an amount of time the data will be stored in the memory device 230.

Embodiments are not limited to the component allocating the first set of memory cells and the second set of memory cells to a first and second type of data, however, and in some embodiments, the component can be configured to allocate the first set of memory cells as multi-level memory cells and allocate the second set of memory cells as single-level memory cells.

In some embodiments, the component is configured to allocate the first set of memory cells such that the first set of memory cells are used prior to the second set of memory cells being used by the memory device, as described in more detail in connection with FIG. 3, herein. However, in other embodiments, the component can be configured to allocate the first set of memory cells and the second set of memory cells such that the grade of the respective sets of memory cells alternates, as described in more detail in connection with FIG. 4, herein. In the event that some sets of memory cells (e.g., the second set of memory cells) fall below a threshold grade (e.g., in the vent that some sets of memory cells exhibit quality attributes that are too low to be of use to the memory device 230), the component can determine that the grade assigned to the second set of memory cells falls below a predetermined grade threshold and cause the second set of memory cells to be retired based on the determination.

In some embodiments, the sets of memory cells can be re-graded over time. For example, if the quality attributes of a set of memory cells alter over the lifetime of the memory sub-system, the component can re-grade the sets of memory cells and re-allocate the sets of memory cells and/or retire the sets of memory cells. The component can re-grade the sets of memory cells as part of a self-test operation initiated by a host, at predetermined times of the lifecycle of the memory sub-system, in response to a command to perform an operation to re-grade the sets of memory cells, or based on a determination that sets of memory cells have degraded due to use.

Figure 3:
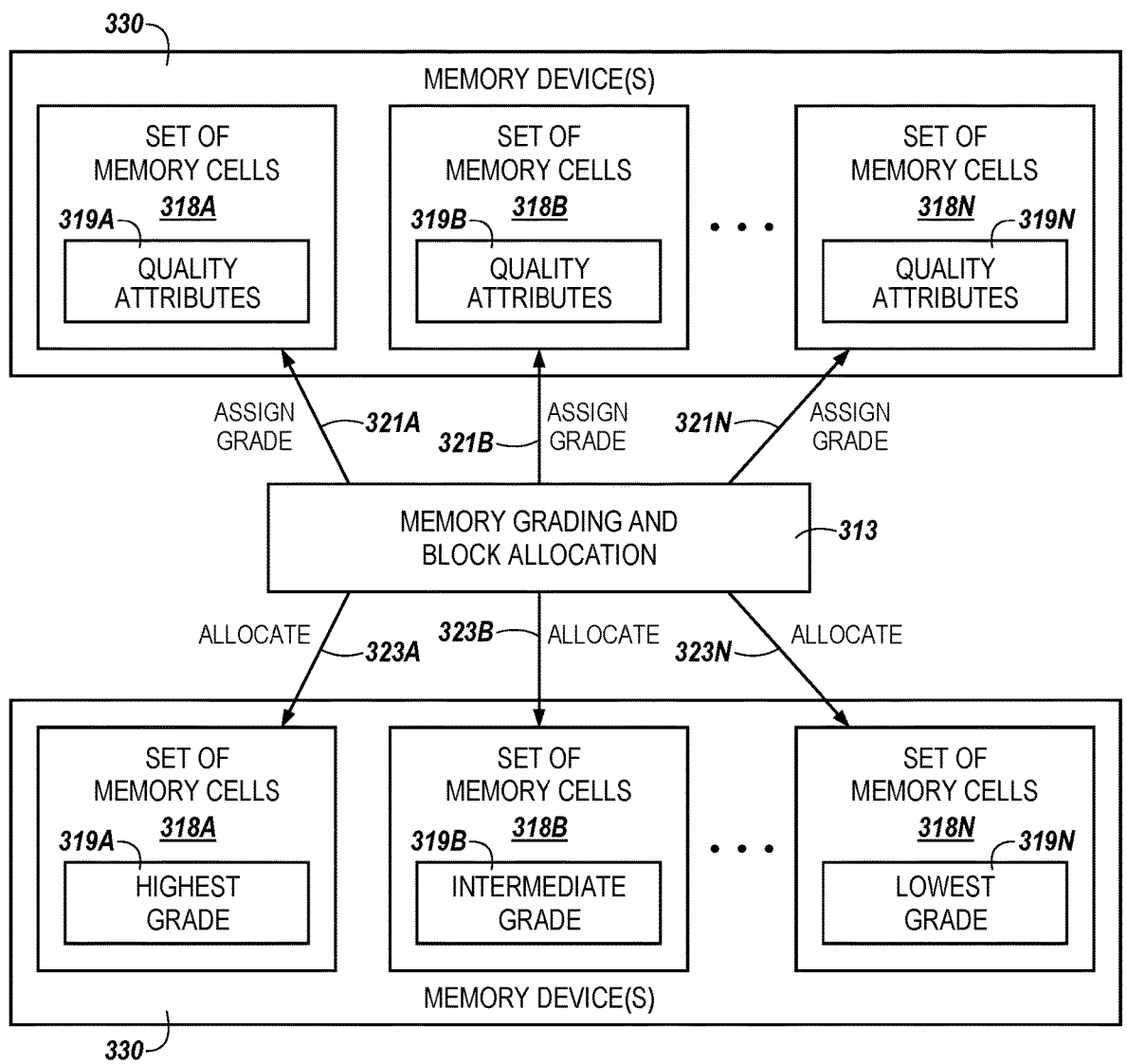
FIG. 3 illustrates an example of a memory grading an allocation component in accordance with some embodiments of the present disclosure.

FIG. 3 illustrates an example of a memory grading an allocation component 313 in accordance with some embodiments of the present disclosure. As shown in FIG. 3, the memory grading and allocation component 313 is coupled to a memory device 330. The memory device 330 shown above the memory grading and block allocation component 313 is the same memory device as the memory device 330 shown below the memory grading and block allocation component 313. However, the upper memory device 330 shows an example of the memory device 330 during a period of time in which the memory grading and block allocation component 313 is assigning grades to the sets of memory cells 318A, 318B to 318N, while the lower memory device 330 shows an example of the memory device 330 during a period of time in which the memory grading and block allocation component 313 is allocating the sets of memory cells 318A, 318B to 318N for use by the memory device 330.

During the first period of time (e.g., during a first phase of memory block grading and allocation), the memory grading and block allocation component 313 can determine quality attributes 319A, 319B to 319N of the sets of memory cells 318A, 318B to 318N and assign grades to each of the sets of memory cells 318A, 318B to 318N as shown by the arrows 321A, 321B to 321N. As described above, the grades can correspond to the robustness of each given set of memory cells 318A, 318B to 318N and can be assigned from a list of at least three distinct grades.

Once the grades have been assigned to the sets of memory cells 318A, 318B to 318N, the memory grading and block allocation component 313 can, during a second period of time (e.g., during a second phase of memory block grading and allocation) allocate the sets of memory cells 318A, 318B to 318N for use by the memory device 330. In the embodiment shown in FIG. 3, the memory grading and block allocation component 313 can allocate, as indicated by the arrows 323A, 323B to 323N) the sets of memory cells 318A, 318B to 318N such that a set of memory cells with a highest grade 322A (e.g., the set of memory cells 318A) is allocated for use by the memory device 330 first. The memory grading and block allocation component 313 can then allocate the sets of memory cells 318A, 318B to 318N such that a set of memory cells with an intermediate grade 322B (e.g., the set of memory cells 318B) is allocated for use by the memory device 330 after the set of memory cells with the highest grade 322A is allocated. The memory grading and block allocation component 313 can then allocate the sets of memory cells 318A, 318B to 318N such that a set of memory cells with a lowest grade 322N (e.g., the set of memory cells 318N) is allocated for use by the memory device 330 after the set of memory cells with the highest grade 322A and the set of memory cells with the intermediate grade(s) 322B are allocated. Although shown in FIG. 3 as having three distinct grades, embodiments are not limited to this particular example and the memory block grading and allocation component 313 can allocate as many intermediate grades 322B as are desired.

Figure 4:
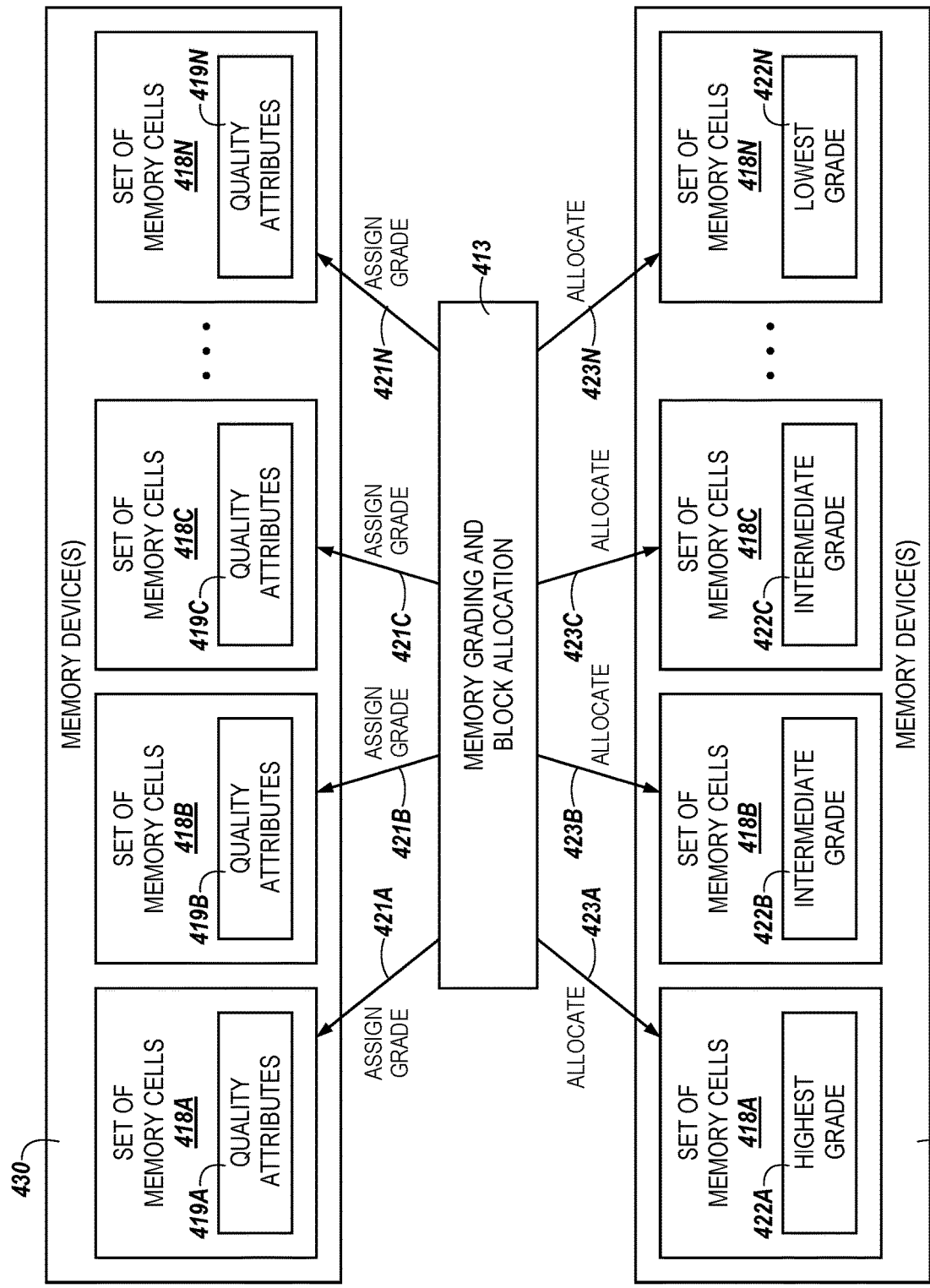
FIG. 4 illustrates another example of a memory grading an allocation component in accordance with some embodiments of the present disclosure.

FIG. 4 illustrates another example of a memory grading an allocation component in accordance with some embodiments of the present disclosure. As shown in FIG. 4, the memory grading and allocation component 413 is coupled to a memory device 430. The memory device 430 shown above the memory grading and block allocation component 413 is the same memory device as the memory device 430 shown below the memory grading and block allocation component 413. However, the upper memory device 430 shows an example of the memory device 430 during a period of time in which the memory grading and block allocation component 413 is assigning grades to the sets of memory cells 418A, 418B, 418C to 418N, while the lower memory device 430 shows an example of the memory device 430 during a period of time in which the memory grading and block allocation component 413 is allocating the sets of memory cells 418A, 418B, 418C to 418N for use by the memory device 430.

During the first period of time (e.g., during a first phase of memory block grading and allocation), the memory grading and block allocation component 413 can determine quality attributes 419A, 419B, 419C to 419N of the sets of memory cells 418A, 418B, 418C to 418N and assign grades to each of the sets of memory cells 418A, 418B, 418C to 418N as shown by the arrows 421A, 421B, 421C to 421N. As described above, the grades can correspond to the robustness of each given set of memory cells 418A, 418B, 418C to 418N and can be assigned from a list of at least three distinct grades.

Once the grades have been assigned to the sets of memory cells 418A, 418B, 418C to 418N, the memory grading and block allocation component 413 can, during a second period of time (e.g., during a second phase of memory block grading and allocation) allocate the sets of memory cells 418A, 418B, 418C to 418N for use by the memory device 430. In the embodiment shown in FIG. 4, the memory grading and block allocation component 413 can allocate, as indicated by the arrows 423A, 423B, 423C to 423N) the sets of memory cells 418A, 418B, 418C to 418N such that a set of memory cells with a highest grade 422A (e.g., the set of memory cells 418A) is allocated for use by the memory device 430 first. The memory grading and block allocation component 413 can then allocate the sets of memory cells 418A, 418B, 418C to 418N such that a set of memory cells 418B with a lowest grade 422N (e.g., the set of memory cells 418B) is allocated for use by the memory device 430 after the set of memory cells 418A with the highest grade 422A is allocated. The memory grading and block allocation component 413 can then allocate the sets of memory cells 418A, 418B, 418C to 418N such that a set of memory cells with a highest grade 422A (e.g., the set of memory cells 418C) is allocated for use by the memory device 430 after the set of memory cells 418B with the lowest grade 422N is allocated. The memory block grading and allocation component 413 can then allocate the sets of memory cells 418A, 418B, 418C to 418N such that a set of memory cells with a lowest grade 422N (e.g., the set of memory cells 418N) is allocated for use by the memory device 430 after the set of memory cells 418C with the highest grade 422A is allocated. In this manner, the memory block grading and allocation component 413 can spread the sets of memory cells 418A, 418B, 418C to 418N such that even wear leveling can be realized during operation of the memory device 430.

Although shown in FIG. 4 as having two distinct alternating grades, embodiments are not limited to this particular example and the memory block grading and allocation component 413 can allocate sets of memory cells having intermediate grades (e.g., the intermediate grades 322B illustrated in FIG. 3) mixed among the sets of memory cells having the highest grades 422A and the sets of memory cells having the lowest grades 422N and/or the memory block grading and allocation component 413 can allocate sets of memory cells having intermediate grades after all the sets of memory cells having the highest and lowest grades are allocated. In some embodiments, the mixing the sets of memory cells such that sets of memory cells with the highest grade 422A are allocated alternately with sets of memory cells having the intermediate grades 422B, 422C, and/or sets of memory cells having the lowest grade(s) 422N can provide consistent performance of the memory device(s) 430 over time.

Figure 5:
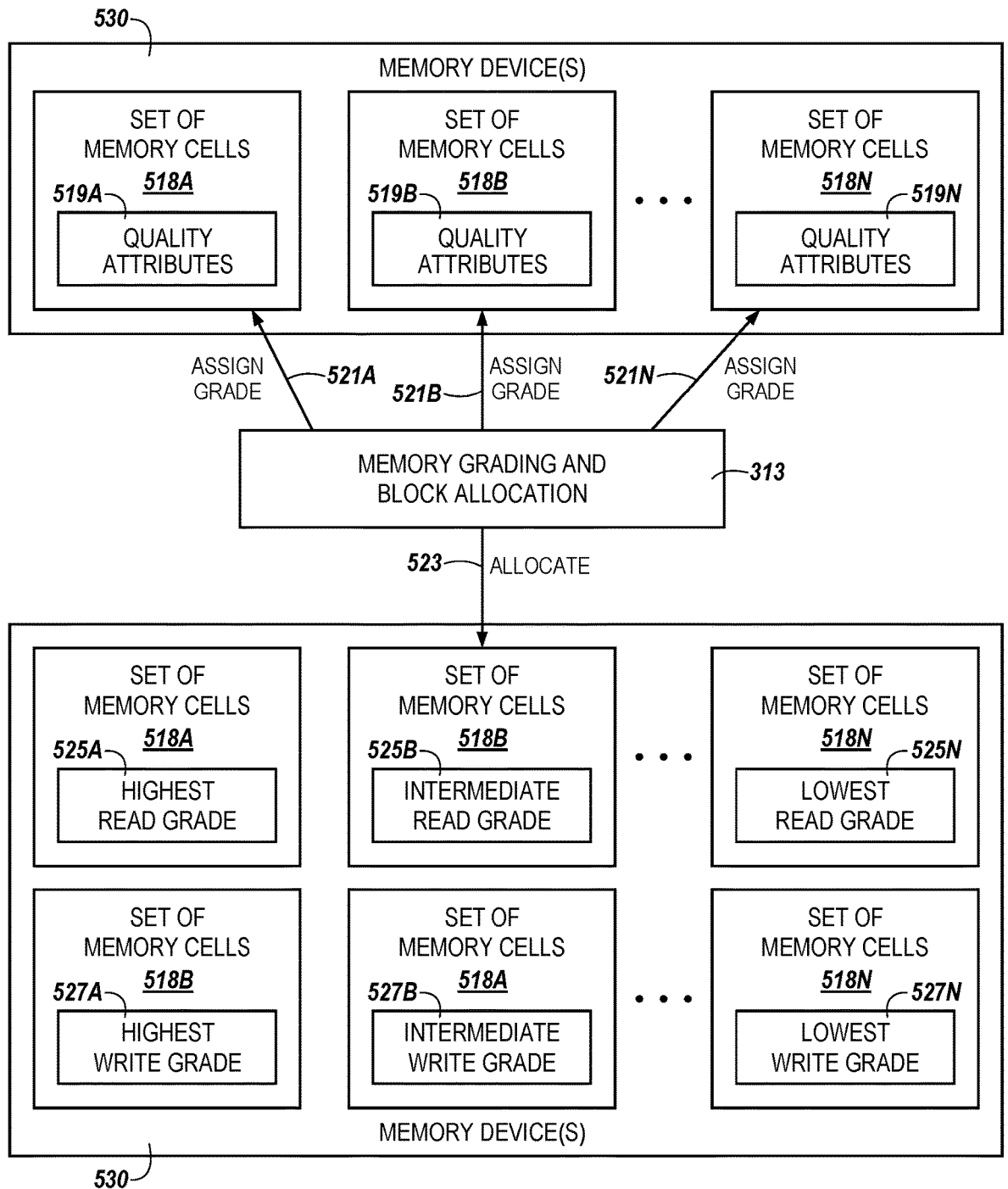
FIG. 5 illustrates yet another example of a memory grading an allocation component in accordance with some embodiments of the present disclosure

FIG. 5 illustrates yet another example of a memory grading an allocation component in accordance with some embodiments of the present disclosure. As shown in FIG. 5, the memory grading and allocation component 513 is coupled to a memory device 530. The memory device 530 shown above the memory grading and block allocation component 513 is the same memory device as the memory device 530 shown below the memory grading and block allocation component 513. However, the upper memory device 530 shows an example of the memory device 530 during a period of time in which the memory grading and block allocation component 513 is assigning grades to the sets of memory cells 518A, 518B to 518N, while the lower memory device 530 shows an example of the memory device 530 during a period of time in which the memory grading and block allocation component 513 is allocating the sets of memory cells 518A, 518B to 518N for use by the memory device 530.

During the first period of time (e.g., during a first phase of memory block grading and allocation), the memory grading and block allocation component 513 can determine quality attributes 519A, 519B to 519N of the sets of memory cells 518A, 518B to 518N and assign grades to each of the sets of memory cells 518A, 518B to 518N as shown by the arrows 521A, 521B to 521N. The grades can correspond to the robustness of each given set of memory cells 518A, 518B to 518N for read operations and the robustness of each given set of memory cells 518A, 518B to 518N for write operations. For example, due to the behavior of some memory devices 530, read operations and write operations can affect the sets of memory cells 518A, 518B to 518N differently and therefore it may be beneficial to rank the sets of memory cells 518A, 518B to 518N in a different order depending on whether read or write operations are being performed using the sets of memory cells 518A, 518B to 518N. Further, as described above, the grades can be assigned from a list of at least three distinct grades.

Once the grades have been assigned to the sets of memory cells 518A, 518B to 518N, the memory grading and block allocation component 513 can, during a second period of time (e.g., during a second phase of memory block grading and allocation) allocate the sets of memory cells 518A, 518B to 518N for use by the memory device 530. In the embodiment shown in FIG. 5, the memory grading and block allocation component 513 can allocate, as indicated by the arrow 523, the sets of memory cells 518A, 518B to 518N such that a set of memory cells with a highest read grade 525A (e.g., the set of memory cells 518A) is allocated for use by the memory device 530 for read operations first. The memory grading and block allocation component 513 can then allocate the sets of memory cells 518A, 518B to 518N such that a set of memory cells with an intermediate read grade 525B (e.g., the set of memory cells 518B) is allocated for use by the memory device 530 for read operations after the set of memory cells with the highest read grade 525A is allocated. The memory grading and block allocation component 513 can then allocate the sets of memory cells 518A, 518B to 518N such that a set of memory cells with a lowest read grade 525N (e.g., the set of memory cells 518N) is allocated for use by the memory device 530 for read operations after the set of memory cells with the highest read grade 525A and the set of memory cells with the intermediate read grade(s) 525B are allocated. Although shown in FIG. 5 as having three distinct grades, embodiments are not limited to this particular example and the memory block grading and allocation component 513 can allocate as many intermediate read grades 525B as are desired.

Similarly, the memory grading and block allocation component 513 can, during a second period of time (e.g., during a second phase of memory block grading and allocation) allocate the sets of memory cells 518A, 518B to 518N for use by the memory device 530. In the embodiment shown in FIG. 5, the memory grading and block allocation component 513 can allocate, as indicated by the arrow 523, the sets of memory cells 518A, 518B to 518N such that a set of memory cells with a highest write grade 527A (e.g., the set of memory cells 518B) is allocated for use by the memory device 530 for write operations first. It is noted that, in the example shown in FIG. 5, the sets of memory cells having the highest read grade 525A is different than the set of memory cells having the highest write grade 527A. The memory grading and block allocation component 513 can then allocate the sets of memory cells 518A, 518B to 518N such that a set of memory cells with an intermediate write grade 527B (e.g., the set of memory cells 518A) is allocated for use by the memory device 530 for write operations after the set of memory cells with the highest write grade 527A is allocated. The memory grading and block allocation component 513 can then allocate the sets of memory cells 518A, 518B to 518N such that a set of memory cells with a lowest write grade 527N (e.g., the set of memory cells 518N) is allocated for use by the memory device 530 for read operations after the set of memory cells with the highest write grade 527A and the set of memory cells with the intermediate write grade(s) 527B are allocated. Although shown in FIG. 5 as having three distinct grades, embodiments are not limited to this particular example and the memory block grading and allocation component 513 can allocate as many intermediate write grades 527B as are desired.

Although shown as being allocated in order of highest read grades 525A and highest write grades 527A to lowest read grades 525N and lowest write grades 527N, embodiments are not so limited. For example, in some embodiments, the memory grading and block allocation component 513 can allocate the sets of memory cells 518A, 518B to 518N in the manner shown in FIG. 4, or any other ordering scheme that is desired.

Figure 6:
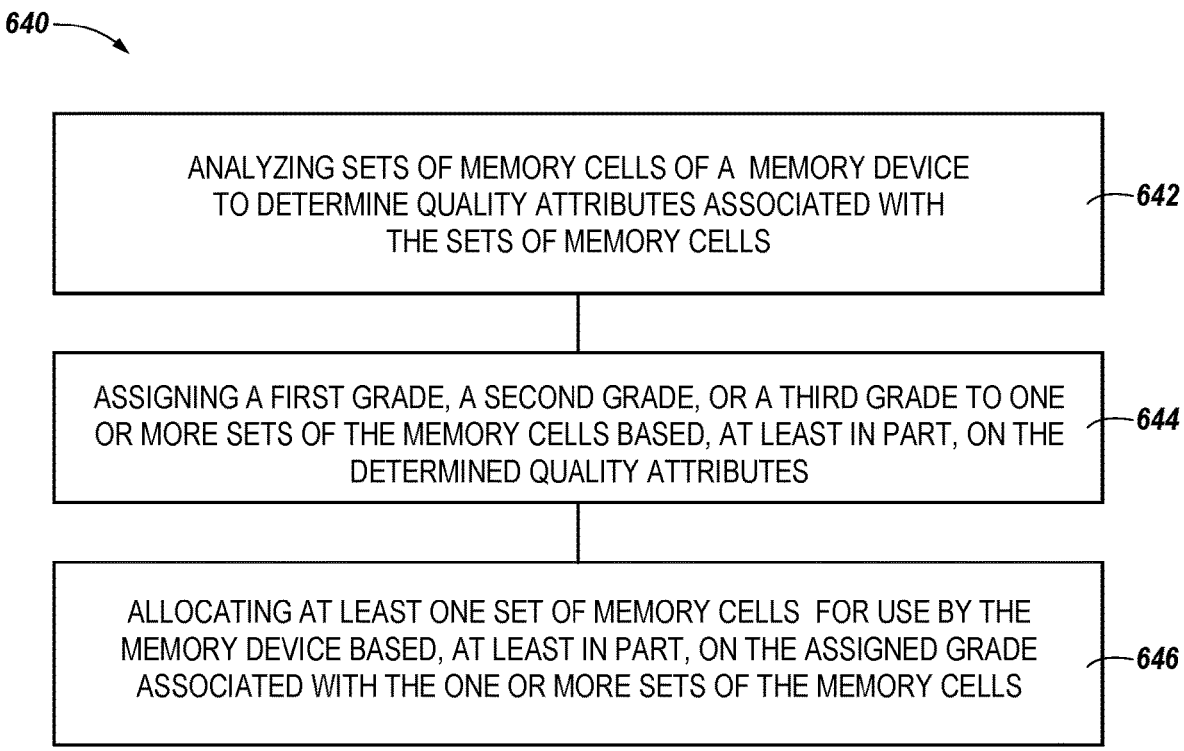
FIG. 6 is a flow diagram corresponding to a memory grading and allocation component in accordance with some embodiments of the present disclosure.

FIG. 6 is a flow diagram of an example method 640 corresponding to a memory grading and allocation component in accordance with some embodiments of the present disclosure. The method 640 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 640 is performed by the memory block grading and allocation component 113 of FIG. 1, the memory block grading and allocation component 213 of FIG. 2, the memory block grading and allocation component 313 of FIG. 3, the memory block grading and allocation component 413 of FIG. 4, and/or the memory block grading and allocation component 513 of FIG. 5. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 642, the method 640 can include analyzing sets of memory cells of a memory device to determine quality attributes associated with the sets of memory cells. The sets of memory cells can be analogous to the sets of memory cells 218A to 218N illustrated in FIG. 2, the sets of memory cells 318A to 318N illustrated in FIG. 3, and/or the sets of memory cells 418A to 418N illustrated in FIG. 4, etc. while the quality attributes can be analogous to the quality attributes 319A to 319N illustrated in FIG. 3 and/or the quality attributes 419A to 419N illustrated in FIG. 4, etc. In some embodiments, the memory device can be analogous to the memory devices 130 illustrated in FIG. 1 and/or the memory devices 230 illustrated in FIG. 2.

At block 644, the method 640 can include assigning a grade to one or more sets of the memory cells based, at least in part, on the determined quality attributes. As described above, the grades can be used to rank a quality or robustness of the sets of memory cells. In some embodiments, there can be at least three distinct grades assigned to the sets of memory cells. This can allow for an improved stratification of the grades of the sets of memory cells in comparison to approaches that rely on "good set of cells/bad set of cells" dichotomy described above.

At block 646, the method 640 can include allocating at least one set of memory cells for use by the memory device based, at least in part, on the assigned grade associated with the one or more sets of the memory cells. For example, the method 640 can include allocating the at least one of the sets of memory cells for use by the memory device such that a first set of the memory cells that has a higher assigned grade than a second set of the memory cells is used prior to the second set of memory cells being used by the memory device. Embodiments are not so limited, however, and the method 640 can include any of the allocation schemes described above in connection with FIGS. 1-5.

In some embodiments, the method 640 can include assigning a first grade to a first set of the memory cells and assigning a second grade to a second set of the memory cells. The method 640 can further include determining that the first grade is indicative of the quality attributes of the first set of memory cells being higher than the quality attributes of the second set of memory cells and allocating the first set of memory cells for use by the memory device for a first type of data based on the determination and/or allocating the second set of memory cells for use by the memory device for a second type of data based on the determination. As described above, the types of data can include system critical data vs. non-critical data, data that can be accessed frequently vs. data that can be seldom accessed, data that is accessed vs data that is cached, etc. For example, the method 640 can include assigning a first grade to a first set of the memory cells, assigning a second grade to a second set of the memory cells, determining that the first grade is indicative of the quality attributes of the first set of memory cells being higher than the quality attributes of the second set of memory cells, and/or allocating the second set of memory cells for use by the memory device as a cache based on the determination.

In some embodiments, the method 640 can include assigning a first grade to a first set of the memory cells, assigning a second grade to a second set of the memory cells, determining that the first grade is indicative of the quality attributes of the first set of memory cells being higher than the quality attributes of the second set of memory cells, and/or allocating the second set of memory cells to a particular tier of the memory device based on the determination. As described above, the particular tier of the memory device can correspond to an amount of time the data will be stored by the memory device. For example, data can be stored in sets of memory cells having different grades based on the amount of time the data will be stored by the memory device. In this manner, data that will be stored for a longer period of time can be stored in sets of memory cells having lower grades than data that will be stored for shorter periods of time in higher graded sets of memory cells.

The method 640 can further include assigning a first grade to a first set of the memory cells and assigning a second grade to a second set of the memory cells. In some embodiments, the method 640 can further include determining that the first grade is indicative of the quality attributes of the first set of memory cells being higher than the quality attributes of the second set of memory cells and allocating, for use by the memory device, particular sets of the memory cells having the first grade assigned thereto and particular sets of the memory cells having the second grade assigned thereto such that the memory device alternates between using the particular sets of the memory cells having the first grade assigned thereto and the particular sets of the memory cells having the second grade assigned thereto, as described above in connection with FIG. 2.

Figure 7:
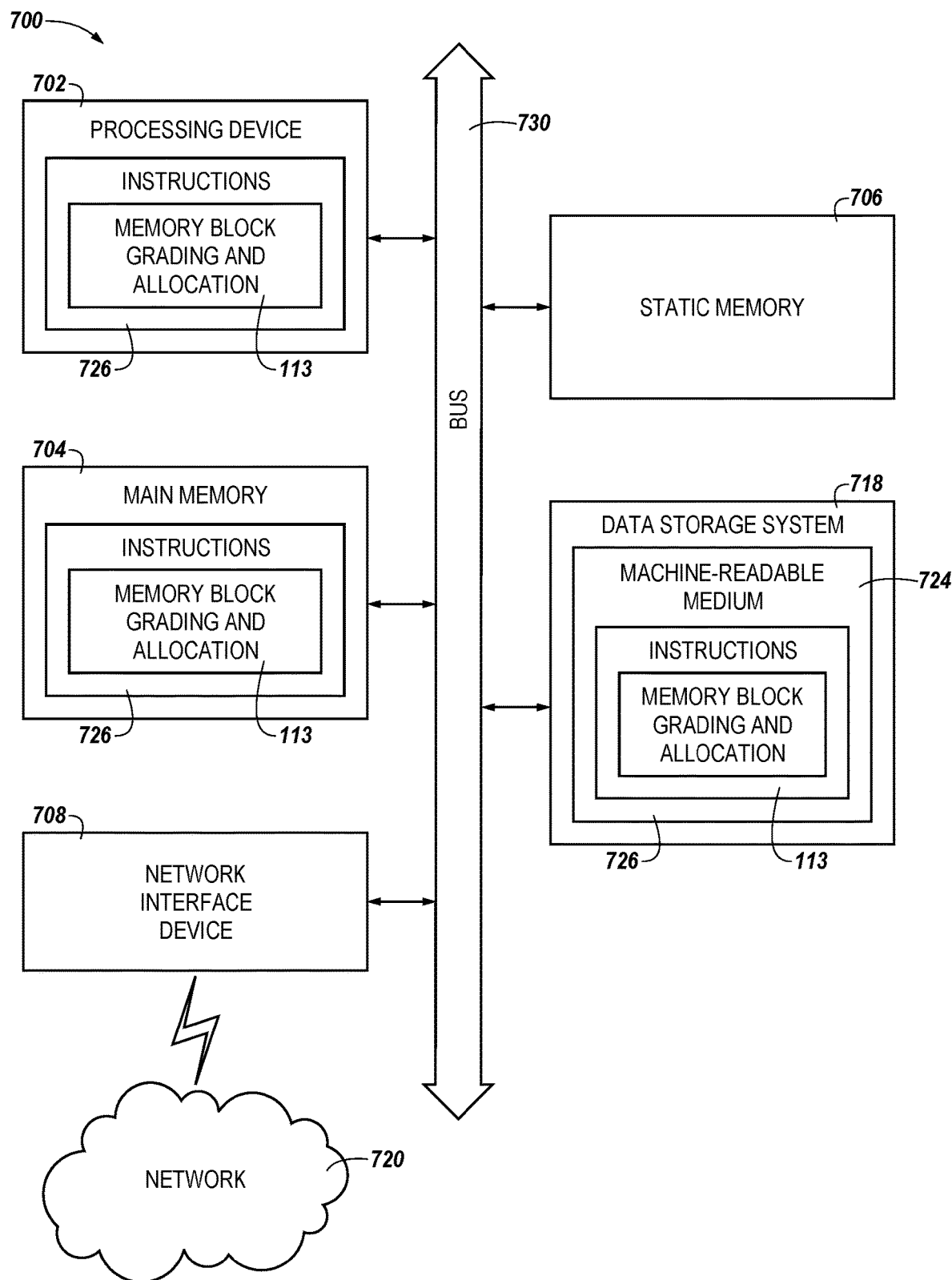
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory block grading and allocation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a memory block grading and allocation component (e.g., the memory block grading and allocation component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
 a component coupleable to a memory device, wherein the component is, during fabrication or testing of the memory device, configured to:
  analyze a plurality of sets of memory cells of the memory device to determine quality attributes associated with the plurality of sets of memory cells;
  assign grades to one or more sets of the memory cells based, at least in part, on the determined quality attributes;
  allocate a first one of the plurality of sets of memory cells for use by the memory device for critical system data based, at least in part, on the assigned grade associated with the first one of the plurality of sets of memory cells being higher than a grade assigned to a second one of the plurality of sets of memory cells, wherein the critical system data include data to be retained for greater than a threshold period of time; and
  allocate the second one of the plurality of sets of memory cells for use in caching data associated with the memory device based, at least in part, on the assigned grade associated with the second one of the plurality of sets of memory cells being lower than the assigned grade of the first one of the plurality of sets of memory cells, wherein the caching data comprises data to be retained for less than the threshold period of time.

2. The apparatus of claim 1, wherein the grades are assigned from a quantity of grades comprising at least three grades.

3. The apparatus of claim 1, wherein the quality attributes comprise at least one of a residual bit error rate, an erase disturb susceptibility, a program disturb susceptibility measure, a read disturb susceptibility measure, a data retention error rate, or a physical location of the one or more sets of the memory cells, or combinations thereof.

4. The apparatus of claim 1, wherein the component comprises an application-specific integrated circuit or a field-programmable gate array.

5. The apparatus of claim 1, wherein the component is configured to allocate a first set of memory cells among the plurality that has a higher assigned grade than a second set of memory cells among the plurality such that the first set of memory cells is used by the memory device prior to the second set of memory cells being used by the memory device based, at least in part, on the grade assigned to the first set of memory cells and the grade assigned to the second set of memory cells.

6. The apparatus of claim 1, wherein the component is configured to:
 assign a first grade to a first set of the plurality of memory cells;
 assign a second grade to a second set of the plurality of memory cells;
 determine that the first grade is indicative of the quality attributes of the first set of memory cells being higher than the quality attributes of the second set of memory cells;
 allocate the first set of memory cells for use by the memory device for a first type of data based on the determination; and
 allocate the second set of memory cells for use by the memory device for a second type of data based on the determination.

7. The apparatus of claim 1, wherein the component is configured to:
 assign a first grade to a first set of the plurality of memory cells;
 assign a second grade to a second set of the plurality of memory cells;
 determine that the first grade is indicative of the quality attributes of the first set of memory cells being higher than the quality attributes of the second set of memory cells;
 allocate the first set of memory cells for use by the memory device as triple level or quad level memory cells based on the determination; and
 allocate the second set of memory cells for use by the memory device as triple level or single-level memory cells based on the determination.

8. A method, comprising:
analyzing a first set of memory cells of a memory device to determine quality attributes associated with the first set of memory cells;
analyzing a second set of memory cells of the memory device to determine quality attributes associated with the second of set of memory cells;
assigning a first grade, a second grade, or a third grade to the first set of the memory cells based, at least in part, on the determined quality attributes of the first set of memory cells;
assigning a different one of the first grade, the second grade, or the third grade to the second set of the memory cells based, at least in part, on the determined quality attributes of the second set of memory cells;
allocating the first set of memory cells for use by the memory device for critical system data based, at least in part on the grade assigned to the first set of memory cells being higher than the grade assigned to the second set of memory cells, wherein the critical system data include data to be retained for greater than a threshold period of time; and
allocating the second set of memory cells for use by the memory device in caching data associated with the memory device based, at least in part, on the different grade assigned to the second set of memory cells being lower than the grade assigned to the first set of memory cells, wherein the analyzing, assigning, and allocating wherein the caching data comprises data to be retained for less than the threshold period of time, and are performed during fabrication of the memory device.

9. The method of claim 8, wherein the quality attributes comprise at least one of a residual bit error rate, an erase disturb susceptibility, a data retention error rate, a program disturb susceptibility measure, a read disturb susceptibility measure, or a physical location of the one or more sets of the memory cells, or combinations thereof.

10. The method of claim 8, further comprising allocating the set of memory cells for use by the memory device such that a first set of the memory cells that has a higher assigned grade than a second set of the memory cells is used prior to the second set of memory cells being used by the memory device.

11. The method of claim 8, further comprising:
determining that the first grade is indicative of the quality attributes of the first set of memory cells being higher than the quality attributes of the second set of memory cells;
allocating the first set of memory cells for use by the memory device for a first type of data based on the determination; and
allocating the second set of memory cells for use by the memory device for a second type of data based on the determination.

12. The method of claim 8, further comprising:
assigning the first grade to the first set of the memory cells;
assigning the second grade or the third grade to the second set of the memory cells;
determining that the first grade is indicative of the quality attributes of the first set of memory cells being higher than the quality attributes of the second set of memory cells; and
allocating the second set of memory cells to a particular tier of the memory device based on the determination.

13. The method of claim 8, further comprising:
assigning the first grade to the first set of the memory cells;
assigning the second grade or the third grade to the second set of the memory cells;
determining that the first grade is indicative of the quality attributes of the first plurality of sets of memory cells being higher than the quality attributes of the second plurality of sets of memory cells; and
allocating, for use by the memory device, particular sets of the memory cells having the first grade assigned thereto and particular sets of the memory cells having the second grade or the third grade assigned thereto such that the memory device alternates between using the particular sets of the memory cells having the first grade assigned thereto and the particular sets of the memory cells having the second grade assigned thereto.

14. A system, comprising:
a memory device; and
a component coupled to the memory device and, during fabrication or testing of the memory device, is configured to:
analyze a set of memory cells of the memory device to determine quality attributes associated with the set of memory cells;
analyze a different set of memory cells of the memory device to determine quality attributes associated with the different set of memory cells;
assign a grade to the set of memory cells based, at least in part, on the on the determined quality attributes of the set of memory cells;
assign a different grade to the different set of memory cells based, at least in part, on the determined quality attributes of the different set of memory cells;
allocate the set of memory cells for use by the memory device for critical system data based, at least in part on the grade being higher than the different grade, wherein the critical system data include data to be retained for greater than a threshold period of time; and
allocate the different set of memory cells for use by the memory device for use in caching data associated with the memory device based, at least in part, on the different grade being lower than the grade, wherein the caching data comprises data to be retained for less than the threshold period of time.

15. The system of claim 14, wherein the component is configured to:
allocate the set of memory cells as multi-level memory cells; and
allocate the different set of memory cells as single-level memory cells.

16. The system of claim 14, wherein the component is configured to allocate the set of memory cells such that the set of memory cells are used prior to the different set of memory cells being used by the memory device.

17. The system of claim 14, wherein the component is configured to assign the first grade and the second grade from a continuous spectrum.

18. The system of claim 14, wherein the quality attributes comprise at least one of a residual bit error rate, an erase disturb susceptibility, a data retention error rate, a typical page programming time, a typical page read time, a program disturb susceptibility measure, a read disturb susceptibility measure, or a physical location of the one or more sets of the memory cells, or combinations thereof.

19. The system of claim 14, wherein the component is configured to:
    periodically, or based on events, test the memory cells to determine that the grade assigned to the different set of memory cells falls below a predetermined grade threshold; and
    cause the different set of memory cells to be retired from their current assigned usage or reevaluated for a different tier application, or combinations thereof based on the determination.

* * * * *